United States Patent [19]

Filliman

[11] Patent Number: 4,603,438
[45] Date of Patent: Jul. 29, 1986

[54] TUNING SYSTEM WITH PROVISIONS FOR SKIPPING NONPREFERRED TUNING POSITIONS

[75] Inventor: Paul D. Filliman, Indianapolis, Ind.

[73] Assignee: RCA Corporation, Princeton, N.J.

[21] Appl. No.: 655,691

[22] Filed: Sep. 28, 1984

[51] Int. Cl.⁴ .......................... H03J 7/18; H04B 1/16
[52] U.S. Cl. .................................. 455/166; 455/184; 455/186
[58] Field of Search ................ 455/166, 151, 184–186; 358/194.1

[56] References Cited

U.S. PATENT DOCUMENTS

| | | | |
|---|---|---|---|
| 3,968,444 | 7/1976 | Tenny | 455/166 |
| 4,110,695 | 8/1978 | Klank et al. | 455/186 |
| 4,164,711 | 8/1979 | Steckler | |
| 4,282,516 | 8/1981 | Tults | 455/185 |
| 4,355,415 | 10/1982 | George | |
| 4,361,907 | 11/1982 | Wine | |
| 4,367,559 | 1/1983 | Tults | 455/166 |
| 4,495,654 | 1/1985 | Deiss | 455/166 |
| 4,521,744 | 6/1985 | Yamada et al. | 455/185 |

Primary Examiner—Jin F. Ng
Attorney, Agent, or Firm—Paul J. Rasmussen; Peter M. Emanuel; Adel A. Ahmed

[57] ABSTRACT

In a tuning system for tuning a receiver to various channels, skip channel information is stored in a shift register memory. A channel number counter counts clock pulses which also successively advance data through the shift register. A tuning control signal to tune the receiver to the channel corresponding to the count is generated when the data shifted to the output of the shift register does not define the channel as a channel to be skipped.

7 Claims, 8 Drawing Figures

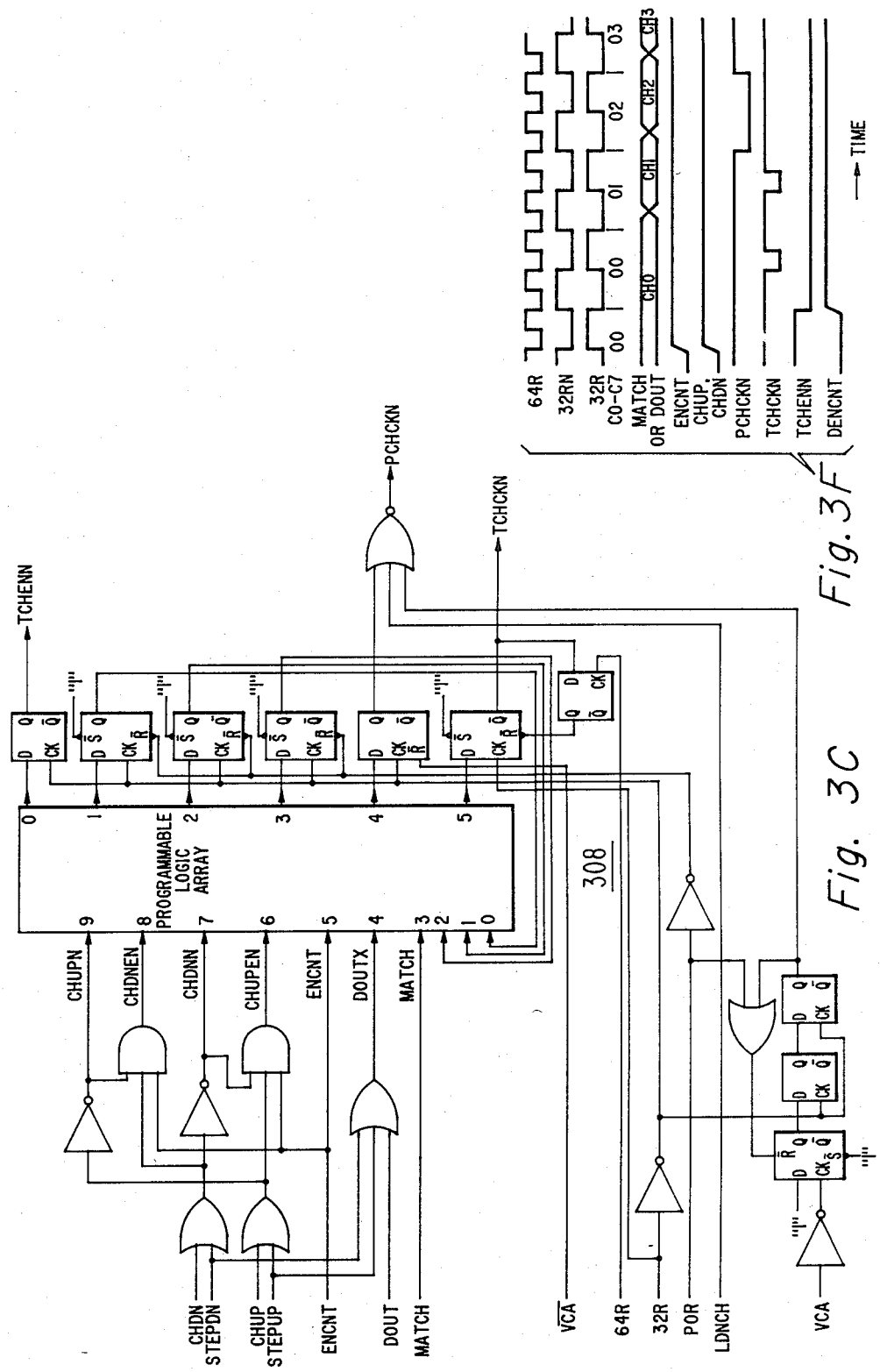

TUNING SYSTEM WITH PROVISIONS FOR SKIPPING NONPREFERRED TUNING POSITIONS

FIELD OF THE INVENTION

The present invention relates to the field of tuning systems for radio frequency receivers, including television receivers and the like, particularly such as include a remote control unit.

BACKGROUND OF THE INVENTION

In a tuning system for a receiver intended for tuning signals occupying identifiable frequency channels, such as a television receiver, it is desirable that the tuning system include provisions for automatically skipping certain channels. The skipped channels may be those not preferred by a user because of their generally unsatisfactory reception characteristics or because of their program content. Receivers providing this feature permit the viewer to select a "skip list" of nonpreferred channels and store this information in a separate memory or they may utilize special encoding to include the skip list information together with tuning information (such as the tuning voltage or channel number) in the same memory. Examples of prior art tuning systems are disclosed in U.S. Pat. No. 4,156,850, issued in the name of Billy W. Beyers, Jr. on May 29, 1979 and entitled "DISPLAY SYSTEM FOR FACILITATING THE SETUP OF A TUNING SYSTEM" and U.S. Pat. No. 4,158,816, issued in the name of Charles M. Wine on June 19, 1979 and entitled "MEMORY TYPE TUNING SYSTEM WITH PROVISIONS FOR SKIPPING NONPREFERRED TUNING POSITIONS".

It is desirable for the skip list to be retained in memory during the period when a mains power line operated receiver is switched off so as to be available whenever the receiver is again switched on. Generally, semiconductor memories are "volatile" and will only retain stored information so long as their operating voltage is maintained. Even the provision of a low power standby power supply derived from the mains power line will not safeguard the contents of a skip list stored in such a "volatile" memory since brief power outages are not uncommon and unplugging of the receiver power supply cord from the power outlet can also be expected. Loss of the skip list under these circumstances would be a considerable annoyance. A battery power supply may be incorporated in the receiver for maintaining the memory. However, batteries have a limited life and the need to keep replacing batteries in a mains power line operated receiver is inconvenient and the task is likely to be neglected. Also, manufacturers generally prefer to avoid the need for user access to any of the internal parts of a television receiver, as might be the case when battery replacement is required.

There exist semiconductor memories, known as nonvolatile memories which retain their contents even after the power supply is removed. However, such memories tend to be more expensive and therefore are generally thought to be less desirable for use in, for example, mass produced television receivers.

It has been recognized that, in contrast with the periodic unavailability of a power supply in, for example, a television receiver, commonly used hand held remote control units for use with such receivers are themselves battery operated and that the remote control unit battery could be used to maintain a small power supply to a semiconductor memory, even at times when the remote control unit is not otherwise in use.

Prior skip list arrangements have generally stored the skip list in a random access memory, usually known as a RAM. A RAM permits any of its memory locations to be addressed at will through appropriate addressing circuitry, e.g., by way of "column" and "row" addresses. The present inventor has recognized that a RAM with enough memory locations for each of the channels (e.g., television broadcast channels 2-83 and cable distribution channels 2-99 in the United States) is of considerable complexity compared with the function of storing channels to be skipped. Moreover, the power requirement for maintaining the contents of a RAM is so high that if it were contained in a remote control unit, it would unacceptably reduce the battery service life.

SUMMARY OF THE INVENTION

In accordance with an aspect of the invention, skip channel information is stored in a shaft register memory which includes a plurality of memory cells coupled in cascade, coupled between input and output ports which are the only access points. In response to clock pulses, data is successively advanced through the shift register memory means as a channel number counter counts. A control unit generates a tuning control signal to tune the receiver to the channel corresponding to the channel number count only when the data which has been shifted to the output of the shift register does not define the channel as a channel to be skipped.

BRIEF DESCRIPTION OF THE DRAWING

FIGS. 3A-F show partly in logic symbol form and patly in block diagram form an implementation of the remote control unit shown in FIG. 1 and certain waveforms helpful in understanding the operation.

DETAILED DESCRIPTION

Figure 1:
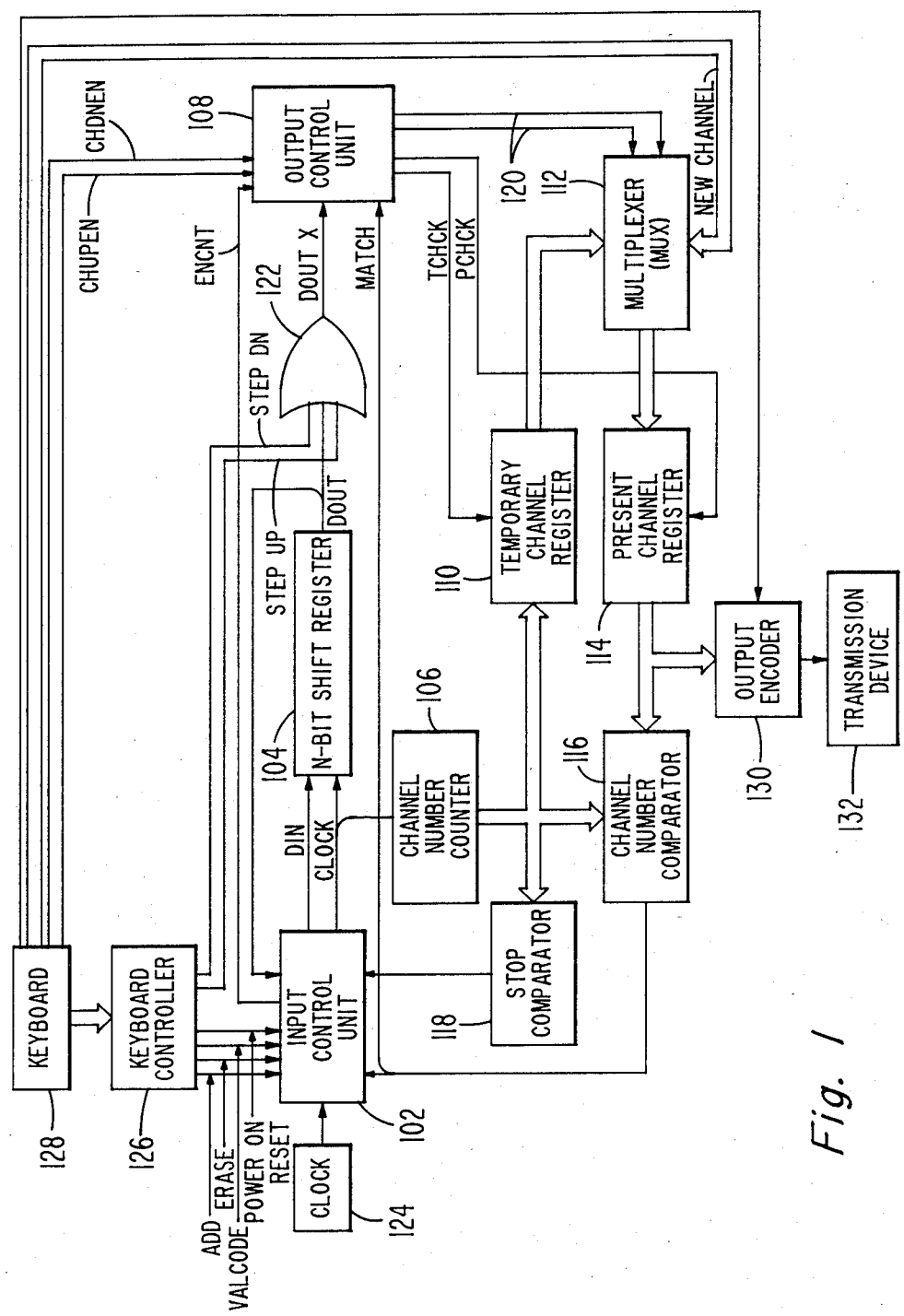
FIG. 1 shows in block diagram form a remote control transmitter unit with provisions for skipping nonpreferred channels constructed in accordance with the present invention.

In the remote control transmitter of FIG. 1, a keyboard 128 is used for entering tuning channel information for controlling the tuning of, for example, a television receiver. By using 0-9 digit keys provided on keyboard 128 a user may enter a two digit channel number for selection of a corresponding channel. The STEP UP and STEP DOWN keys cause the selected channel number to increase or decrease by a count of 1, respectively, for a "scan" type of channel selection operation. While this function is desirable for providing scanning through every channel to which the receiver may be tuned, it is also desirable to provide an alternative scanning mode of tuning in which nondesired channels will be skipped while scanning through the channels. The skipped channels may be those not preferred by the user because they are associated with unsatisfactory reception quality or because of the type of programming associated with the broadcasts on that channel. The skip mode of scanning up and down through the channel numbers is activated by the CHANNEL UP and CHANNEL DOWN keys, respectively. In the present invention, the group of channels to be skipped or the "skip list" is stored in a shift register 104, in contrast to prior systems, which use a random access memory or RAM for this purpose.

The manner in which the skip list is stored in shift register 104 in FIG. 1 in response to the operation of ADD and ERASE keys of keyboard 128 will be explained in detail later. For the present, it will be assumed that the skip list has already been stored in shift register 104.

Shift register 104 comprises a number of memory elements coupled to a cascade arrangement between an input terminal and an output terminal. A bit having a high logic level or low logic level is applied to the input terminal and on the occurrence of a clock pulse, the bit at the input terminal is transferred into the first memory cell in the chain. Subsequent clock pulses transfer the bit from the first memory cell into the second and so on, until the bit appears at the output terminal, which for an N-cell shift register will occur on the N-th clock pulse from the first. Thus, on the occurrence of each clock pulse, the bit at the input terminal will be entered into the register to be advanced towards the output terminal by each subsequent clock pulse, being preceded along its way by earlier entered bits and being followed by later entered bits.

Shift register 104 is capable of storing as many bits as there are cells. However, no stored information can be retrieved from storage unless it is transferred to the output terminal. In the present arrangement, the skip list is stored in the individual memory cells of shift register 104, where, for example, a stored high logic level or a logic "1" corresponds to a preferred channel not to be skipped and a logic "0" corresponds to a channel to be skipped. In the skip mode of tuning, the shift register output, DOUT is fed back by a control unit 102 to the shift register input DIN. Thus, clocking of the shift register will cause the stored data to be continuously circulated through the shift register.

The clock signal, derived by an output control unit 102 from the output of a clock oscillator 124, is supplied to shift register 104 and to a channel counter 106. Whenever a clock pulse advances a bit by one cell in shift register 104, channel counter 106 is likewise advanced by one count. For an N-bit shift register, channel counter 106 is arranged to be a modulo-N counter. Therefore, if channel counter 106 is started at a count of, for example, 00, data stored in the shift register will have undergone one complete circulation and will be back in the original cell positions occupied in the shift register for the same number of clock pulses which will cause channel counter 106 to be returned to 00. The number stored in or the count of channel counter 106 is therefore a unique indentifying number for a particular bit stored in shift register 104. The counts of channel counter 106 correspond to channel numbers and desirably repesent channel numbers directly. Thus, channel counter 106 maybe thought of as a channel number counter.

In the skip mode of tuning, the skip data shifted to DOUT by the shift register 104 is examined by an output control unit 108 in conjunction with the number stored in counter 106. For example, in the CHANNEL UP skip mode of tuning, the bit at shift register output DOUT is examined by output control unit 108 and, if it is found to be a logic "0", indicating a channel to be skipped, control unit 108 allows another clock pulse to shift the next bit to shift register output DOUT and to increment counter 106 by 1. This process continued until a bit at DOUT is a logic "1" indicating a channel not to be skipped. At this point control logic 108 causes the number in counter 106 to be transferred to a present channel register 114 from which it is transmitted to a remote control receiver in the television receiver cabinet (not shown) as will be later explained in detail. In the television receiver cabinet, a tuning control signal is generated in response to the received channel number, which causes the receiver to be tuned to the corresponding channel.

A more detailed description of the FIG. 1 embodiment follows.

The signals generated by keyboard 128 in response to the operation of the 0–9 keys, STEP UP, STEP DOWN, CHANNEL UP, CHANNEL DOWN, ADD, and ERASE keys are applied to keyboard controller 126 which supplies corresponding signals to operate the system in accordance with the operated key. During a scanning mode of channel selection, output control unit 108 controls multiplexer 112 by a signal on control connections 120, causing it to couple the output of temporary channel register 110 to present channel register 114. For direct entry of channel numbers by the use of the digit keys of keyboard 128, multiplexer 112 is caused to couple channel number representative signals from keyboard controller 126 by way of a NEW CHANNEL bus to present channel register 114.

In response to the operation of one of the ADD and ERASE keys, keyboard controller 126 applies a corresponding ADD or ERASE signal and a VALCODE signal which indicates to input control unit 102 whether a valid key operation has been performed. Keyboard controller 126 also supplies a POR (power on reset) signal to input control unit 102 which resets the initial state in the system for proper operation after operating power has been applied. As earlier indicated, control unit 102 controls the application of clock pulses from clock oscillator 124 to shift register 104 and to channel number counter 106. Control unit 102 also applies a signal ENCNT (enable output control unit) to output control unit 108 and controls the level of the signal at the input of shift register 104 DIN in accordance with which one, if either, of the ADD and ERASE signals has been generated. The signal at DIN applied from control unit 102 is caused to become a logic "1" indicating a preferred channel, when the ADD signal is generated and a logic "0", indicating a channel to be skipped, when the ERASE signal is generated. When neither of the ADD and ERASE signals is present, the DOUT is fed back to DIN by way of control unit 102.

Control unit 102 is arranged to continue supplying clock pulses to shift register 104 whenever clocking has begun until a stop comparator 118, which is responsive to the count of channel number counter 106, indicates that a count of 00 has been reached, whereupon control unit 102 no longer supplies clock pulses to shift register 104 and channel number counter 106. In other words, every operation requiring clocking of shift register 104 will be ended by the data bits in shift register 104 being fully circulated back to the positions they occupied at the start of the operation.

If channel information is to be entered in the skip list for a preferred channel not to be skipped, the user enters the channel number by means of the 0–9 digit keys and then operates the ADD key. In response, signals corresponding to the channel number, ADD and VALCODE are generated by keyboard controller 126. The channel number representative signals are coupled to multiplexer 112 which is controlled by output control unit 108. Control unit 108 causes multiplexer 112 to couple the channel number representative signals at its input to present channel register 114, in which they are latched in response to a PCHCK (present channel clock) signal also generated by the control unit 108. Responsive to the ADD and VALCODE signals, input control unit 102 causes channel number counter 106 to begin counting and shift register 104 to begin shifting by the application of clock pulses.

The count of channel number counter 106 is compared at each step in a channel number comparator 116 with the channel number corresponding count previously latched in present channel register 114. When a match occurs, comparator 116 generates a MATCH signal and in response input control unit 102 forces the signal at shift register 104 input DIN to a logic "1" which is consequently stored in shift register 104. For the following and subsequent counts no match occurs and the DIN line again merely recirculates the shift register output data back into its input. Control unit 108 continues to allow clock pulses to be applied until stop comparator 118 recognizes that the count of channel number counter 106 has reached 00 causes clocking to stop. At this point, channel number counter 106 has a count of 00 and the data in shift register 104 has been completely recirculated to its original position, and a logic "1" has been stored in the location corresponding to the channel number entered by the user and stored in present channel register 114.

As earlier noted, the operation of STEP UP and STEP DOWN keys of keyboard 128, respectively causes the channel numbers to be stepped up and stepped down in unit steps. Operation of either one of these keys causes a logic "1" to be entered into output control unit 108 on DOUTX, by way of inputs STEP UP and STEP DN to OR-gate 122. This simulates the bits shifted to DOUT all being a logic "1" and thus effectively causes every channel number to be selected (i.e., not to be skipped).

Keyboard controller 126 also applies appropriate signals to an output encoder 130 causing it to produce a serial code output derived from the count stored in present channel register 114 after completion of a channel selection operation in response to the operation of keys of keyboard 128. The serial code is transmitted by transmission device 132 which may take any of several forms, such as an arrangement for modulating an infrared or ultrasonic carrier signal with the serial code. The code is received by a receiver in the television receiver cabinet, and after decoding, causes corresponding tuning of the television receiver to take place.

It is understood that power supply and other conventional connections are appropriately provided, even though not specifically shown in FIG. 1. It is also understood that a power supply is required continuously to maintain the contents of the memory cells of shift register 104, even when other portions of the FIG. 1 unit are not being powered. The power supply for shift register 104 may conveniently be provided by direct connection (i.e., not through any switches) from the battery of the remote control transmitter.

In the further description of FIG. 1 which follows, illustrative examples are also described, which are helpful in providing a clearer understanding of the invention. For the purpose of the present example, let it be assumed that present channel register 114 has the number 04 latched in it and, as a result, the receiver is presently receiving channel 4. Further, assume that the skip memory has stored in it the information that channel 3 and channel 7 are the only channels not to be skipped.

The operation of the CHANNEL UP function will next be described. As has been explained, channel number counter 106 is reset to a count of 00 after each operation and data in shift register 104 is fully recirculated with channel number 00 corresponding to the data in the first cell of shift register 104 (even if no actual channel 00 is used, it is convenient to use this designation). Selection of the CHANNEL UP function causes channel number counter 106 to begin counting and shift register 104 to begin shifting under the control of input control unit 102. Also, under the control of keyboard controller 126, CHUPEN (channel up enable) and ENCNT (enable output control unit) signals are caused to become "1". The CHUPEN and ENCNT signals are coupled to output control unit 108.

Since the receiver is presently receiving channel 4, so that in progressing from a count of 00, channel number counter 106 will reach a count of 03 (a channel not to be skipped) before reaching a count of 04, the present channel. Thus, when channel number counter 106 reaches a count of 03, shift register 104 will produce a logic "1" on DOUT, indicating that channel 3 is not to be skipped. Since CHUPEN (channel up enable) is at "1", output control unit 108 causes a TCHCK (temporary channel clock) signal to be "1", which in turn causes the count of 03 in channel number counter 106 to be entered into a temporary channel register 110. Thereafter, regardless of changes in the signal level on DOUT, output control unit 108 causes TCHCK to be "0" and waits for channel number comparator 116 to produce a MATCH signal of "1", indicating that the count in channel number counter 106 matches the count in present channel register 114. From the time that the CHANNEL UP function has been selected, multiplexer 112 continuously couples temporary channel register 110 to present channel register 114 but the contents of present channel register 110 are not changed because output control unit 108 continues to keep the signal PCHCK (present channel clock) at "0" and present channel register 114 continues to exhibit a count of 04. A match will occur between the contents of present channel register 114 and channel number counter 106 when channel number counter 106 exhibits a count of 04, causing MATCH to become a "1". At this point, if the CHANNEL UP function is no longer being selected, PCHCK (present channel clock) is caused to be a "1", present channel register 114, to store a count of 03 according to the present example, since temporary channel register 110 to which it is coupled by way of multiplexer 112 exhibits the count 03. If, the CHANNEL UP function continues to be selected, DOUT will change to "1", indicating that channel 7 is a channel not to be skipped, when channel number counter 106 reaches a count of 07. Output control unit 108 then causes (temporary channel clock) to become "1". This means that a count of 07 will be stored in temporary channel register 110. As long as the CHANNEL UP function continues to be selected, both TCHCK and PCHCK will remain at "0", which means that temporary channel register 110 continues to exhibit a count of 07 and present channel register 114 continues to exhibit a count of 04. Meanwhile, even though channel number counter 106 may be continuing to count, both temporary channel register 110 and present channel register 114 retain their respective contents until CHUPEN becomes "0", that is, until the CHANNEL UP function is no longer being selected. When this occurs, output control unit 108 causes PCHCK to become "1", that is, present channel register 114 clock is enabled and it will thus acquire a count of 07 by way of multiplexer 112 from temporary channel register 110. This count will remain latched in present channel register 114. In summary therefore, the CHANNEL UP function has caused a count of 07 to be latched in the present channel register channel, 7 being the first channel not to be skipped found in ascending numerical order from channel 4, which was being received at the time the CHANNEL UP function was selected.

In the above example, if the initial conditions are changed such that channel 3 was presently being received instead of channel 4, the sequence is different, as follows. When circulation counter 106 reaches a count of 03, both MATCH and DOUT signals become "1". In this case, output control unit 108 responds to the MATCH signal, regardless of DOUT, and causes TCHCK (temporary channel clock) to become "1", which causes a count of 03 from channel number counter 106 to be latched in temporary channel register 110. The sequence followed thereafter is the same as in the previous example except for the result that 04 becomes stored in present channel register 114, thus indicating that the tuning process correctly stopped at the first channel not to be skipped, i.e. channel 4.

The operational sequence for the CHANNEL DOWN function will be illustrated by a first example in which channels 2, 3, and 7 are stored in the skip memory as channels not to be skipped and channel 4 is presently being received. Selection of the CHANNEL DOWN function causes CHDNEN (channel down enable) and ENCNT signals to become "1". DOUT will be "1" when circulation counter 106 reaches a count of 02. Output control unit 108 will then cause TCHCK (temporary channel clock) to become "1". Therefore, a count of 02 will be entered into temporary channel register 110 from channel number counter 106. When channel number counter 106 reaches a count of 03, DOUT will be "1". Output control unit 108 then causes TCHCK (temporary channel clock) to become "1", which will cause a count of 03 to be entered into temporary channel register 110 from channel number counter 106, replacing the previous count of 02. When channel number counter 106 reaches a count of 04, comparator 116 will cause MATCH to become "1" when a match occurs between the counts of circulation counter 106 and present channel register 114, corresponding to the originally assumed condition that channel 4 was presently being received when the CHANNEL DOWN function was selected. In response to MATCH being "1", output control unit 108 causes PCHCK (present channel clock) to become "1". This causes the count of 03 to be entered into present channel register 114 from temporary channel register 110 by way of multiplexer 112. By causing this operation to be repeated, as required, output control unit 108 ensures that the contents of temporary channel register 110 will be successively replaced by higher number channels not to be skipped, up to and including the highest channel number not to be skipped before a MATCH signal occurs at the channel presently being received. At such point, this last number will be entered into present channel register 114, thus replacing the channel presently being received by the next lower number channel in the skip list as a channel not to be skipped.

If the facts of the illustrative problem are changed such that channel 4 is presently being received and there are no channels below channel 4 which are stored in the skip memory as channels not to be skipped, the sequence will be different, as follows. When channel number counter 106 reaches a count of 04, channel number comparator 116 causes MATCH to become "1", and in response, output control unit 108 causes TCHCK (temporary channel clock) to become "1", thus transferring a count of 04 from channel number counter 106 into temporary channel register 110. When channel number counter 106 reaches a counter of 07, DOUT becomes "1". Output control unit 108 then causes TCHCK (temporary channel clock) to become "1", causing a count of 07 to be transferred from channel number counter 106 to temporary channel register 110. No further MATCH or DOUT "1" signals occur up to the maximum count. When the CHANNEL DOWN function is no longer being selected, CHDNEN becomes "0", whereupon output control unit 108 causes PCHCK (present channel clock) to become "1". This causes a count of 07 to be entered into present channel register 114 from temporary channel register 110, indicating that the CHANNEL DOWN function, having found no channels not be skipped below the channel presently being received, has selected the highest channel not to be skipped, which is actually numerically above the channel presently being received. Thus, there has been a "wraparound" of the channel numbers.

Figures 3A, 3D, 3E:
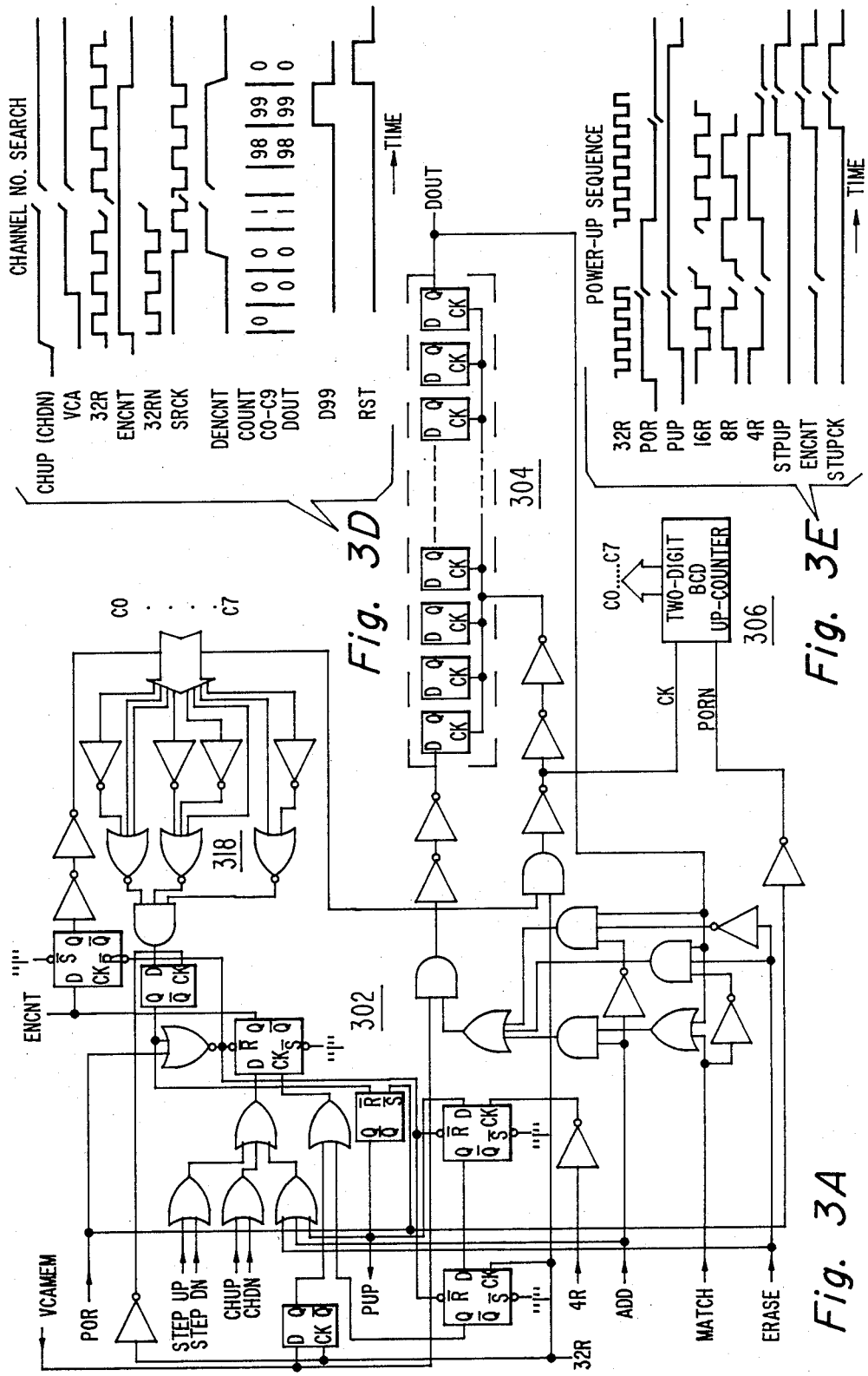
Figure 3B:
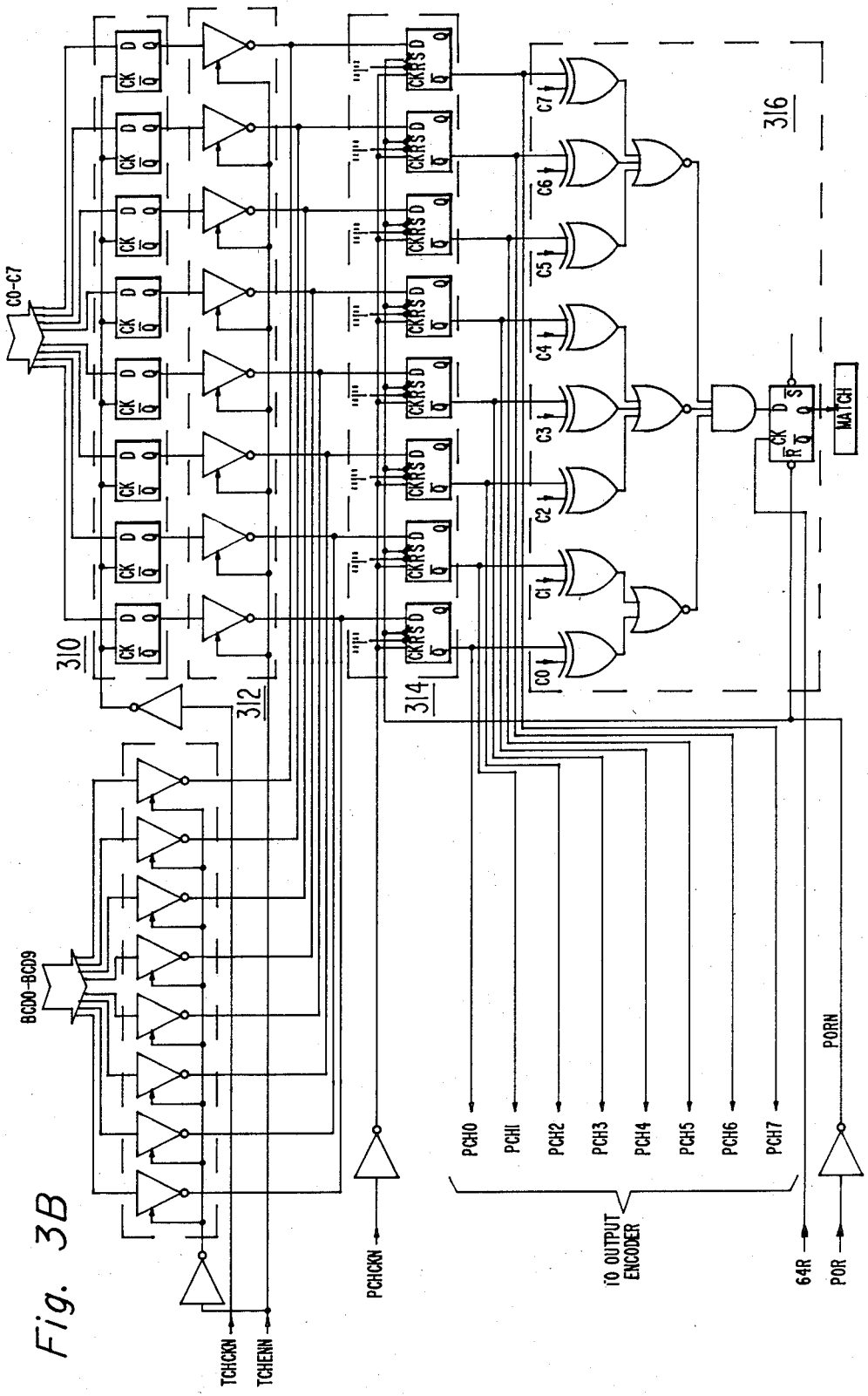

FIGS. 3A-C show an implementation of the FIG. 1 embodiment of the invention. Reference numerals in FIGS. 3A-C generally designate the portions of the system corresponding to the blocks designated in FIG. 1 by reference numerals having the same two least significant digits. For example, channel number counter 106 in FIG. 1 corresponds to counter 306 in FIG. 3A.

Designations used in FIGS. 3A-F have the following significance:

| | |
|---|---|
| ADD | :a signal for adding to the skip list a channel not to be skipped. |
| CHDN | :channel down; a signal for scanning in decreasing numerical order through channels stored in the skip list as channels not to be skipped. |
| CHDNEN | :channel down enable. |
| CHUP | :(channel up); the same as CHDN but in increasing numerical order. |
| CHUPEN | :channel up enable. |
| DOUT | :data out; the shift register output on which the output bit appears. |
| ENCNT | :enable output control unit. |
| ERASE | :a signal for removing from the skip list a channel previously stored as a channel not to be skipped. |
| LDNCH | :load new channel; a signal that originates from keyboard controller 126 to switch the input of multiplexer 112 to keyboard entry. |
| MATCH | :the output of comparator 116. |
| PCH | :present channel; bits representing the present channel register count. |
| PCHCK(N) | :present channel clock (negative). |
| POR | :power on reset; a signal which occurs when the battery supply is first connected. |
| PUP | :power up pulse; a signal which occurs whenever the circuitry is switched on for use. |
| STEP DN | :step down; a signal for scanning in decreasing numerical order in decrements of one count through all available channel numbers. |

-continued

| | |
|---|---|
| STEP UP | :the same as STEP DN but in increasing numerical order. |
| STU | :start up clock |
| TCHCK(N) | :temporary channel clock (negative); the clock signal control for temporary channel register 110. |
| TCHEN(N) | :temporary channel enable (negative); a signal controlling multiplexer 112. |
| VCA(MEM) | :valid code available (for memory); a signal indicating that a proper keyboard entry has been made. |

Generally, conventional logic symbols have been used in FIG. 3. In reference to the inverter gates forming part of multiplexer 312, it should be noted that these inverters are provided with a control input which is symbolized by a connection with an arrow on one of the sides of the triangular inverter symbol. When the logic level at this control terminal is "0", the inverter functions normally. When the logic level is "1", the inverter transmits no signals and its output impedance becomes very high.

Figure 2:
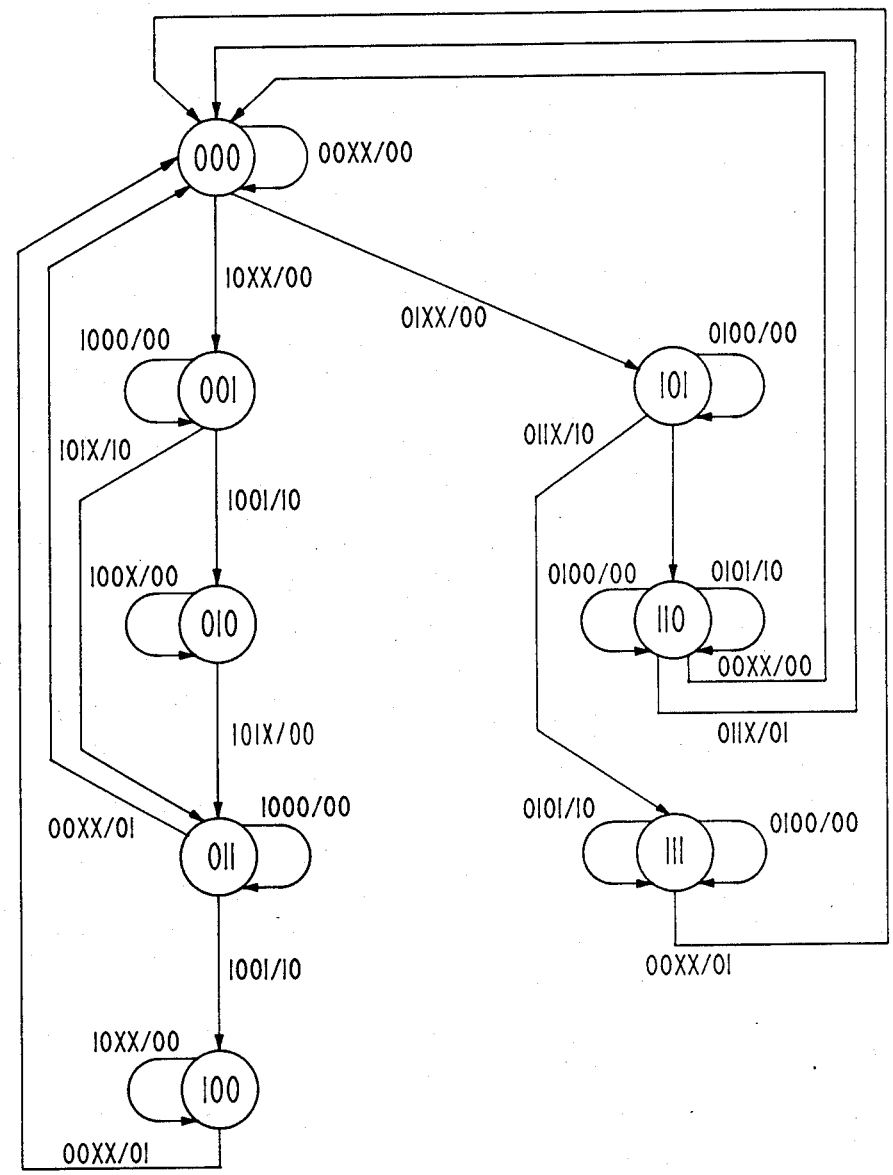
FIG. 2 shows a state diagram indicating certain logic states and transitions between them useful in facilitating an understanding of the operation of the non-preferred channel skipping provisions shown in FIG. 1.

The state diagram of FIG. 2 and the corresponding truth table of TABLE 1 define the sequential operation of output control unit 108.

number followed by a two digit number, for example 1001/10. The four digit number indicates the binary logic levels of the four input signals of output control unit 108, namely: CHUPEN, CHDNEN, MATCH, and DOUT respectively. The following two digit number indicates the binary logic level of the two output signals of output control unit 108, namely: TCHCK, and PCHCK respectively. The four digit number represents the logic condition which causes the change of state along the path designated in FIG. 2 by the four digit number to take place and the two digit number shows the logic result of that operation having taken place. For example, state 001 is connected to state 010 by the line marked 1001/10, which means that if the following condition obtains:

when CHUPEN (channel up enable) is "1";
CHDNEN (channel down enable) is "0";
MATCH is "0"; and
DOUT is "1", then the system will change from state 001 to state 010 and at the same time cause TCHCK (temporary channel clock) to become "1"; and PCHCK (present channel clock) to become "0". Where X appears in a numeral, it indicates that it is

TABLE 1

TRUTH TABLE FOR STATE DIAGRAM

| PRESENT | | STATE | CHUPEN | CHDNEN | MATCH | DOUT | TCHCK | PCHCK | NEXT | | STATE |
|---|---|---|---|---|---|---|---|---|---|---|---|
| 0 | 0 | 0 | 0 | 0 | X | X | 0 | 0 | 0 | 0 | 0 |
| 0 | 0 | 0 | 1 | 0 | X | X | 0 | 0 | 0 | 0 | 1 |
| 0 | 0 | 0 | 0 | 1 | X | X | 0 | 0 | 1 | 0 | 1 |
| 0 | 0 | 1 | 1 | 0 | 0 | 0 | 0 | 0 | 0 | 0 | 1 |
| 0 | 0 | 1 | 1 | 0 | 0 | 1 | 1 | 0 | 0 | 1 | 0 |
| 0 | 0 | 1 | 1 | 0 | 1 | X | 1 | 0 | 0 | 1 | 1 |
| 0 | 0 | 1 | 0 | 0 | X | X | 0 | 0 | 0 | 0 | 0 |
| 0 | 0 | 0 | 1 | 0 | 0 | X | 0 | 0 | 0 | 1 | 0 |
| 0 | 1 | 0 | 1 | 0 | 1 | X | 0 | 0 | 0 | 1 | 1 |
| 0 | 1 | 0 | 0 | 0 | X | X | 0 | 0 | 0 | 0 | 0 |
| 0 | 1 | 1 | 1 | 0 | 0 | 0 | 0 | 0 | 0 | 1 | 1 |
| 0 | 1 | 1 | 1 | 0 | 0 | 1 | 1 | 0 | 1 | 0 | 0 |
| 0 | 1 | 1 | 0 | 0 | X | X | 0 | 1 | 0 | 0 | 0 |
| 0 | 1 | 1 | 0 | 0 | X | X | 0 | 0 | 0 | 0 | 0 |
| 1 | 0 | 0 | 1 | 0 | X | X | 0 | 0 | 1 | 0 | 0 |
| 1 | 0 | 0 | 0 | 0 | X | X | 0 | 1 | 0 | 0 | 0 |
| 1 | 0 | 1 | 0 | 1 | 0 | 0 | 0 | 0 | 1 | 0 | 1 |
| 1 | 0 | 1 | 0 | 1 | 0 | 1 | 1 | 0 | 1 | 1 | 0 |
| 1 | 0 | 1 | 0 | 1 | 1 | X | 1 | 0 | 1 | 1 | 1 |
| 1 | 0 | 1 | 0 | 0 | X | X | 0 | 0 | 0 | 0 | 0 |
| 1 | 1 | 0 | 0 | 1 | 0 | 0 | 0 | 0 | 1 | 1 | 0 |
| 1 | 1 | 0 | 0 | 1 | 0 | 1 | 1 | 0 | 1 | 1 | 0 |
| 1 | 1 | 0 | 0 | 1 | 1 | X | 0 | 1 | 0 | 0 | 0 |
| 1 | 1 | 0 | 0 | 0 | X | X | 0 | 0 | 0 | 0 | 0 |
| 1 | 1 | 1 | 0 | 1 | 0 | 1 | 1 | 0 | 1 | 1 | 1 |
| 1 | 1 | 1 | 0 | 1 | 0 | 0 | 0 | 1 | 0 | 0 | 0 |
| 1 | 1 | 1 | 0 | 0 | X | X | 0 | 1 | 0 | 0 | 0 |

In the state diagram of FIG. 2, the circles represent logic states of output control unit 108. The states are numbered 000, 001, and so on, in binary notation. The lines joining states indicate a change from one state to another in the direction of the arrow-head. Lines which originate from one state and loop back to the same state indicate an operation which does not change the state. The individual lines are numbered with a four digit immaterial whether the digit in that position is 1 or 0 for the change to occur.

In FIG. 3C, a programmable logic array is used for implementing a portion of control logic 108. Such arrays can be programmed in accordance with a given set of requirements. In the present case, the programmed logic array is characterized in accordance with the code table given in TABLE 2.

TABLE 2

CODE TABLE FOR PROGRAMMABLE LOGIC ARRAY

| Function | Product Term Input Variable | | | | | | | | | | Active Level Output | | | | | |
|---|---|---|---|---|---|---|---|---|---|---|---|---|---|---|---|---|
| NO. | 9 | 8 | 7 | 6 | 5 | 4 | 3 | 2 | 1 | 0 | 5 | 4 | 3 | 2 | 1 | 0 |
| 0 | — | — | — | — | L | — | — | L | L | L | o | o | o | o | o | A |
| 1 | H | — | H | — | H | — | — | L | L | L | o | o | o | o | o | A |

TABLE 2-continued

CODE TABLE FOR PROGRAMMABLE LOGIC ARRAY

| Function NO. | Product Term Input Variable | | | | | | | | | | Active Level Output | | | | | |
|---|---|---|---|---|---|---|---|---|---|---|---|---|---|---|---|---|
| | 9 | 8 | 7 | 6 | 5 | 4 | 3 | 2 | 1 | 0 | 5 | 4 | 3 | 2 | 1 | 0 |
| 2 | — | — | — | H | — | — | — | L | L | L | o | o | o | o | A | o |
| 3 | — | H | — | — | — | — | — | L | L | L | o | o | A | o | A | o |
| 4 | — | — | — | H | — | L | L | L | L | H | o | o | o | o | A | o |
| 5 | — | — | — | H | — | — | H | L | L | H | A | o | o | A | A | o |
| 6 | — | — | — | H | — | H | L | L | L | H | A | o | o | A | o | o |
| 7 | — | — | — | H | — | — | L | L | H | L | o | o | o | A | o | o |
| 8 | — | — | — | H | — | — | H | L | H | L | o | o | o | A | A | o |
| 9 | — | — | — | H | — | L | — | L | H | H | o | o | o | A | A | o |
| 10 | — | — | — | H | — | H | — | L | H | H | A | o | A | o | o | o |
| 11 | — | L | — | L | — | — | — | L | H | H | o | A | o | o | o | o |
| 12 | — | — | — | H | — | — | — | H | L | L | o | o | A | o | o | o |
| 13 | — | L | — | L | — | — | — | H | L | L | o | A | o | o | o | o |
| 14 | — | H | — | — | — | — | — | H | L | H | o | o | A | o | o | o |
| 15 | — | H | — | — | — | H | L | H | L | H | A | o | o | A | o | o |
| 16 | — | H | — | — | — | — | H | H | L | H | A | o | o | A | A | o |
| 17 | — | H | — | — | — | L | L | H | L | H | o | o | o | o | A | o |
| 18 | — | H | — | — | — | L | L | H | H | L | o | o | A | A | o | o |
| 19 | — | H | — | — | — | H | L | H | H | L | A | o | A | A | o | o |
| 20 | — | H | — | — | — | — | H | H | H | L | o | A | o | o | o | o |
| 21 | — | H | — | — | — | H | — | H | H | H | A | o | A | A | A | o |
| 22 | — | H | — | — | — | L | — | H | H | H | o | o | A | A | A | o |
| 23 | — | L | — | L | — | — | — | H | H | H | o | A | o | o | o | o |

The timing diagrams illustrated in FIGS. 3D–F show the time relationships between various signals in the system and the clock pulses. Specifically, FIG. 3E shows the timing diagram for the POWER UP sequence.

Clearly, the implementation of the invention in accordance with FIGS. 3A–C is illustrative. Various modifications to the logic arrangements will readily suggest themselves to one skilled in the art for implementing the invention in accordance with the foregoing description. Such modifications are contemplated to be within the scope of the present invention.

What is claimed:

1. Apparatus including tuning control means for tuning a receiver to various channels and an arrangement for storing a channel skip information signal for said channels, said signal being of a first type for defining a channel to be skipped, and being of a second type for defining a channel not to be skipped, said arrangement comprising:
   shift register memory means for storing said channel skip information signal, including an input port for receiving said channel skip information signal to be stored and an output port for retrieving a stored channel skip information signal, said memory means comprising a plurality of memory cell means serially coupled between said input and output ports for advancing said stored channel skip information signal from said input port successively to said output port in response to a clock signal;
   a source of clock signal;
   counter means for counting said clock signal;
   control means for selectively coupling said clock signal to said shift register memory means and to said counter means, said control means coupling said clock signal to said shift register memory means and to said counter means in response to a start command signal;
   start means for generating said start command signal;
   channel number entry means for entering channel numbers corresponding to said channels;
   channel skip information entry means for entering a new skip information signal corresponding to one of said channels;
   channel number comparator means for comparing the count of said counter means to a new channel number entered by way of said channel number entry means, said control means coupling said clock signal to said shift register memory means and said counter means when a new channel number is entered, and coupling said new skip information signal to said input port of said shift register memory means when said count corresponds to said new channel number; and
   coupling means having a control input coupled to said output port for coupling the count of said counter means to said tuning control means when said retrieved skip information signal is of said second type.

2. The apparatus recited in claim 1, wherein:
said channel skip information signal storing arrangement is contained in a remote control transmitter including a battery and said battery is coupled to said shift register memory means for maintaining information therein.

3. The apparatus recited in claim 1 further including:
stop comparator means for comparing said count of said counter means to a predetermined number; and wherein
said control means decouples said clock signal from said shift register memory means and said counter means when said count corresponds to said predetermined number.

4. The apparatus recited in claim 1 wherein:
said coupling means includes temporary channel register means for selectively storing the count of said counter means; present channel register means for selectively storing the count stored in said temporary channel register means; channel number comparator means for comparing said count of said counter means to said count stored in said present channel register means; said coupling means coupling said count stored in said present channel register means to said tuning control means when said retrieved skip signal is of said second type;

said control means causes said temporary channel register means to store successive counts of said counter means, each succeeding count replacing the preceding stored count when (a) said retrieved skip information is of said second type, and (b) said succeeding count does not correspond to said count stored in said present register means; and when said succeeding count corresponds to said count stored in said present channel register, said control means causes said present channel register to store said preceding stored count.

5. The apparatus recited in claim 1 further including:
all channel stepping means coupled to said control input of said coupling means for selectively coupling thereto a skip information signal of said second type.

6. The apparatus of claim 1 wherein:
said plurality of memory cell means is a number N, and said counter means is a modulo-N counter.

7. The apparatus recited in claim 1, wherein:
said output port of said shift register memory means is coupled to said input port.

* * * * *